(12) United States Patent
Eun et al.

(10) Patent No.: US 8,547,752 B2
(45) Date of Patent: Oct. 1, 2013

(54) METHOD OF READING DATA IN NON-VOLATILE MEMORY DEVICE, AND DEVICE THEREOF

(75) Inventors: Hee Seok Eun, Hwaseong-si (KR); Jae Hong Kim, Seoul (KR); Kyoung Lae Cho, Yongin-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 117 days.

(21) Appl. No.: 13/198,750

(22) Filed: Aug. 5, 2011

(65) Prior Publication Data
US 2012/0033502 A1 Feb. 9, 2012

(30) Foreign Application Priority Data
Aug. 6, 2010 (KR) .................. 10-2010-0076112

(51) Int. Cl.
*G11C 11/34* (2006.01)
(52) U.S. Cl.
USPC ................... 365/185.22; 365/185.24

(58) Field of Classification Search
USPC ........................ 365/185.22, 185.24
See application file for complete search history.

(56) References Cited

U.S. PATENT DOCUMENTS

| 6,847,553 | B2 | 1/2005 | Chen et al. |
| 7,352,628 | B2 | 4/2008 | Kamei |
| 7,443,729 | B2 | 10/2008 | Li et al. |
| 2007/0253249 | A1* | 11/2007 | Kang et al. ............. 365/185.03 |
| 2008/0198650 | A1* | 8/2008 | Shalvi et al. ............. 365/185.02 |
| 2008/0253188 | A1* | 10/2008 | Aritome ................. 365/185.17 |
| 2010/0182839 | A1* | 7/2010 | Kim et al. ............... 365/185.19 |

* cited by examiner

*Primary Examiner* — Michael Tran
(74) *Attorney, Agent, or Firm* — Stanzione & Kim, LLP

(57) ABSTRACT

A method of reading data in a non-volatile memory device. The method includes reading a plurality of memory cells of a first page in a memory cell array using a first read level, reading a plurality of memory cells of a second page adjacent to the memory cells of the first page using a second read level, determining whether a state of each memory cell of the first page has been changed based on the first read level to verify a threshold voltage of each memory cell of the second page based on the second read level, and revising the state of each memory cell of the second page according to a result of the determination.

18 Claims, 13 Drawing Sheets

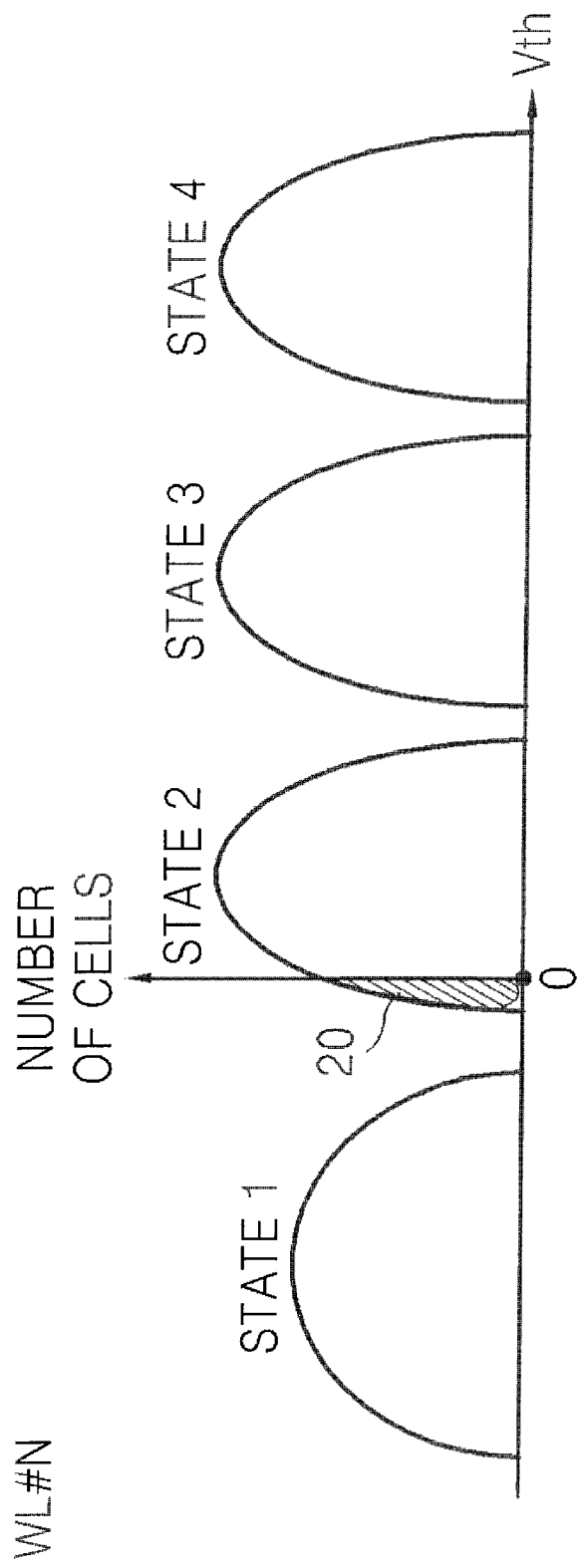

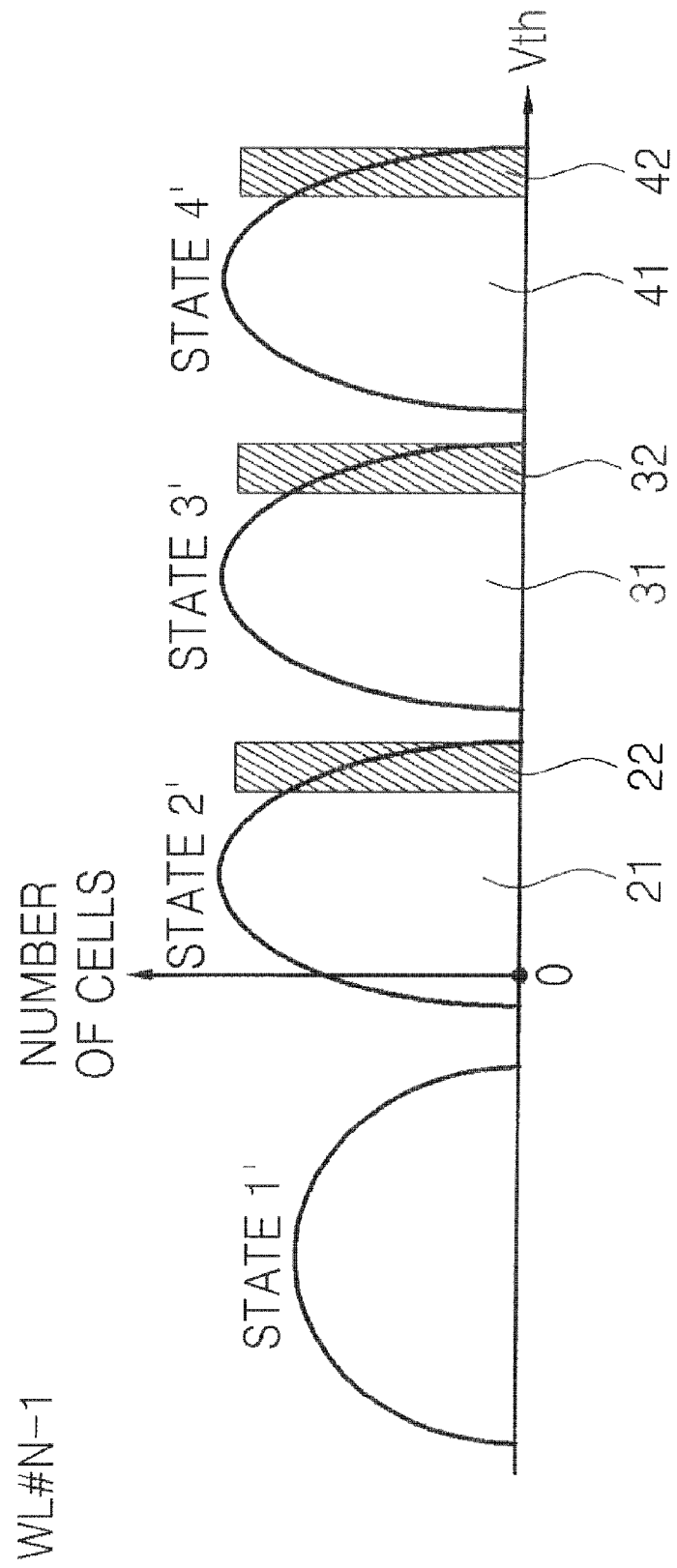

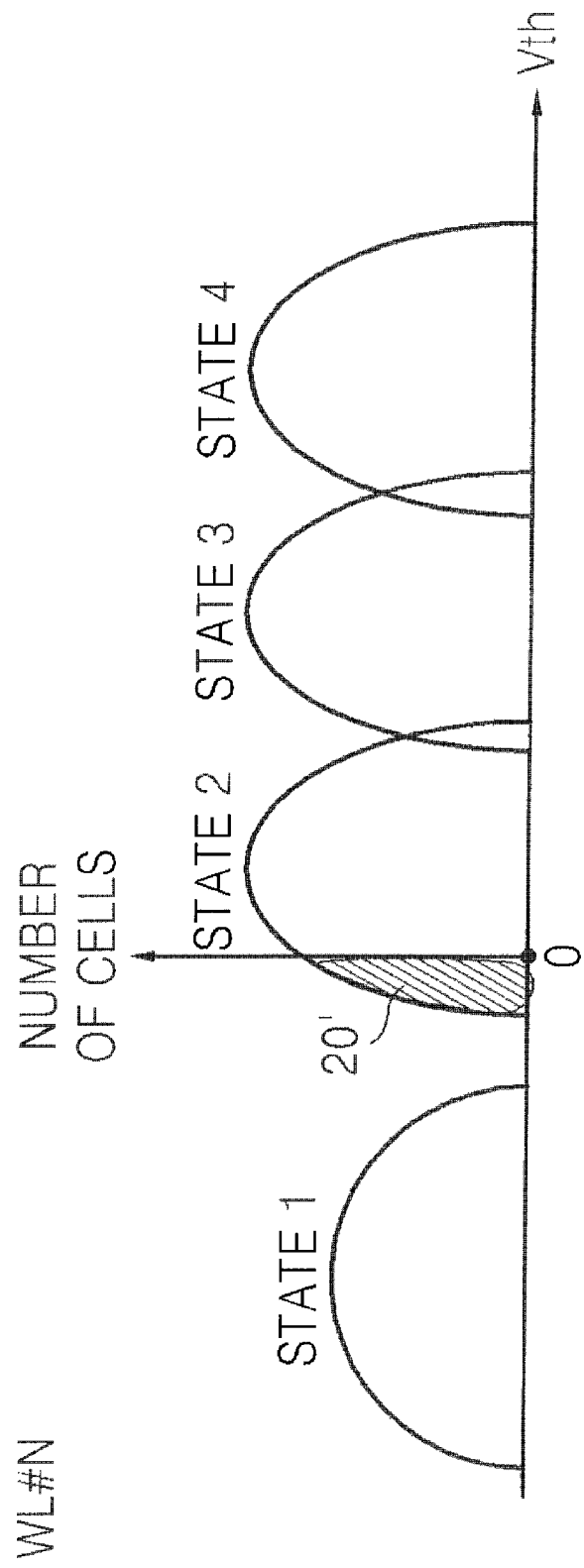

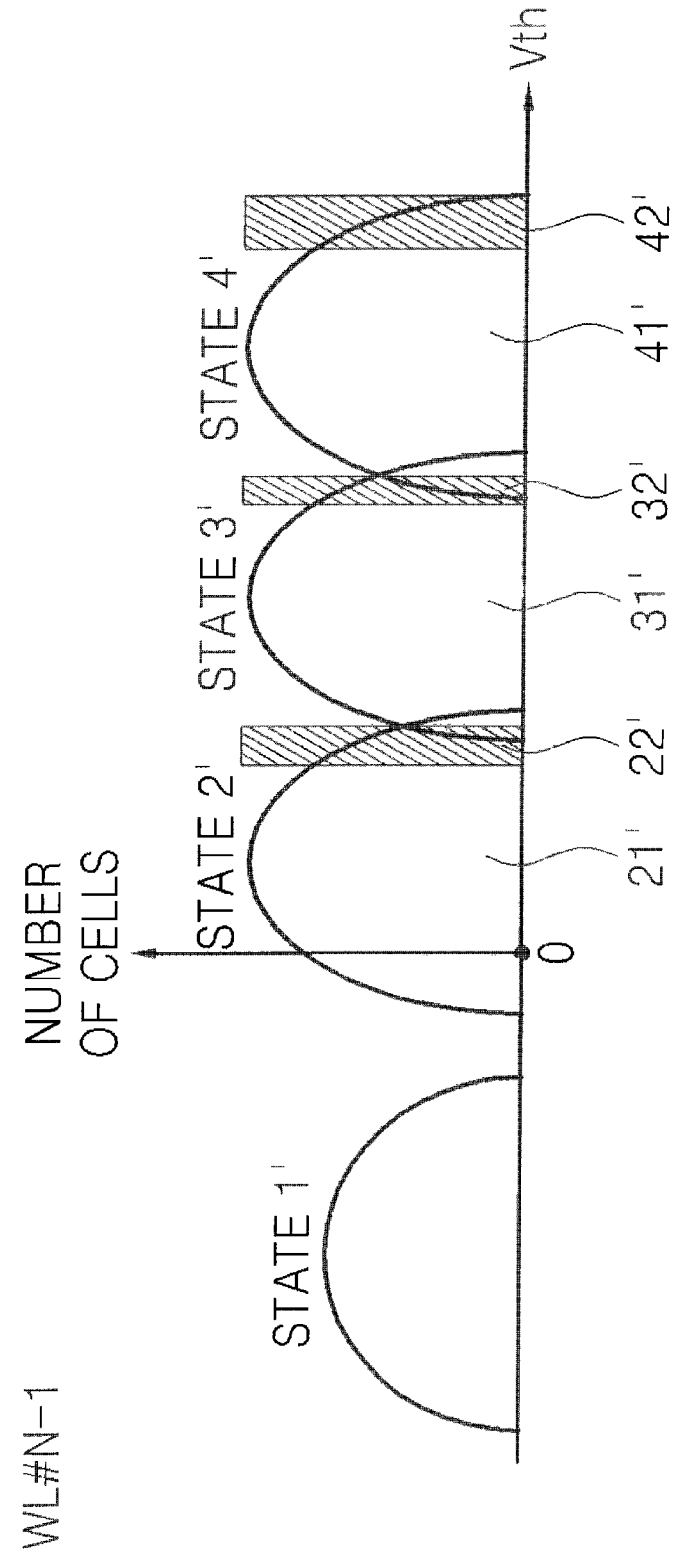

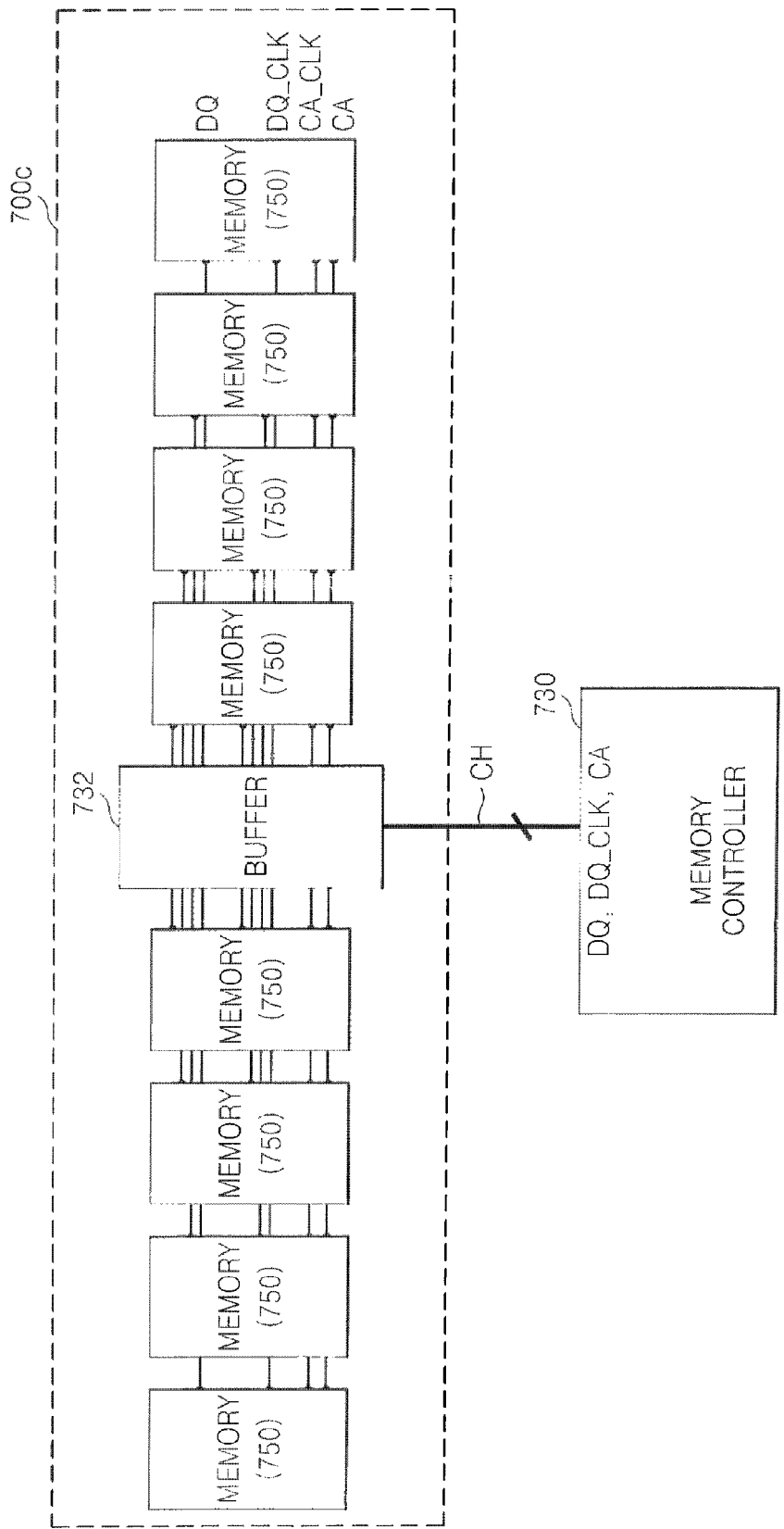

METHOD OF READING DATA IN NON-VOLATILE MEMORY DEVICE, AND DEVICE THEREOF

CROSS-REFERENCE TO RELATED APPLICATIONS

A claim of priority under 35 U.S.C. §119 is made to Korean Patent Application No. 10-2010-0076112, filed Aug. 6, 2010, in the Korean Intellectual Property Office, the disclosure of which is incorporated herein in its entirety by reference.

BACKGROUND OF THE INVENTION

1. Field of the Invention

The present inventive concept relates to a method of reading data stored in a non-volatile memory device and a recording medium, and more particularly, to a method of effectively reading the state of a memory cell during a reading operation when the memory cell has a negative threshold voltage due to a charge loss or other particular causes in a non-volatile memory device, and to a recording medium realizing the same.

2. Description of the Related Art

To store a large amount of data, a level memory that can store at least two bits in a single memory cell has been developed. Furthermore, with the miniaturization of elements, a capacity coupling effect occurs between floating gates of adjacent cells. When data is written to a memory cell, the threshold voltage of a memory cell adjacent to the memory cell that the data is written to increases due to such capacity coupling effects.

It has been attempted to secure a margin between cell distributions considering charge losses and to improve capacity coupling effects. However, when a memory cell has a negative threshold voltage due to a charge loss or other particular causes, a method of effectively reading the state of the memory cell during a read operation is desired.

SUMMARY OF THE INVENTION

Some embodiments of the present inventive concept provide a method of effectively reading the state of a memory cell during a reading operation when the memory cell has a negative threshold voltage due to a charge loss or other particular causes in a non-volatile memory device, a memory controller to perform the same, and a recording medium.

Additional aspects and advantages of the present general inventive concept will be set forth in part in the description which follows and, in part, will be obvious from the description, or may be learned by practice of the general inventive concept.

According to some embodiments of the present inventive concept, there is provided a method of reading data in a non-volatile memory device. The method includes reading a plurality of memory cells of a first page in a memory cell array using a first read level, reading a plurality of memory cells of a second page adjacent to the memory cells of the first page using a second read level, determining whether a state of each memory cell of the first page has been changed based on the first read level to verify a threshold voltage of each memory cell of the second page based on the second read level, and revising the state of each memory cell of the second page according to a result of the determination.

According to other embodiments of the present inventive concept, there is provided a memory controller to control a memory device. The memory controller reads memory cells using read levels and can include a reverse module configured to enable a first page to be read again using a first read level when a second page, which has not been read and is adjacent to the first page that has already been read, is read using a second read level; and a revision module configured to revise the first read level when the first page is read again using the first read level.

According to other embodiments of the present invention, there is provided a method of reading a memory cell array of a non-volatile memory device, the method comprising: estimating a threshold voltage variation of a memory cell array; and outputting a command signal to a controller of the memory cell array to revise a read level of the memory cell array according to the result of the estimation.

In an embodiment, the estimating comprises: reading a second page of the memory cell array which had not been read and is adjacent to a first page that has already been read; and enabling reading or revision of a memory cell using a read level of the first page in the memory cell array such that a reading order is changed According to other embodiments of the present invention, there is provided a method of determining a programmed state of memory cells, the method comprising: revising a read level of memory cells of a first word line plural times; and determining which memory cells of an adjacent word line directly correspond to memory cells of the first word line whose states frequently change due to the threshold voltage variations in the first word line.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 3A and 3B show the distributions of memory cells in an N-th word line and an (N−1)-th word line according to some embodiments of the present inventive concept;

FIGS. 5A and 5B show the distributions of memory cells in the N-th word line and the (N−1)-th word line that have reached an end-of-life (EOL) stage, according to some embodiments of the present inventive concept.

FIGS. 8A through 8C are block diagrams of memory modules 700a through 700c according to different embodiments of the present inventive concept.

DETAILED DESCRIPTION OF THE PREFERRED EMBODIMENTS

Figure 1A:
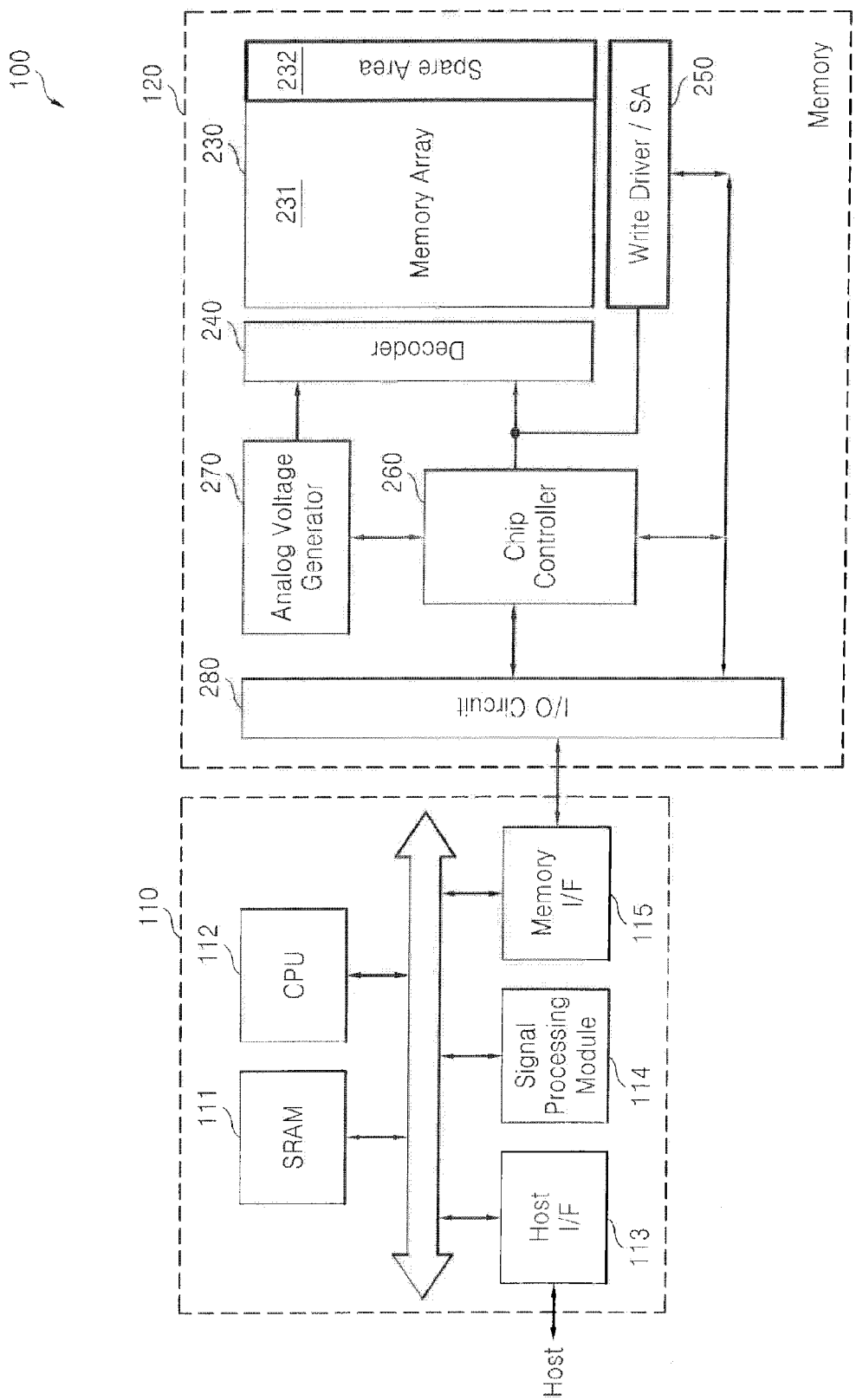
FIG. 1A is a block diagram of a non-volatile memory system according to some embodiments of the present inventive concept.

The present inventive concept will now be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a block diagram of a non-volatile memory system 100 according to some embodiments of the present inventive concept. The non-volatile memory system 100 includes a non-volatile memory device 120 and a memory controller 110 that controls the non-volatile memory device 120.

The non-volatile memory device 120 includes a memory cell array 230, a decoder 240, a write driver/sense amplifier (SA) circuit 250, a chip controller 260, an analog voltage generator 270, and an input/output (I/O) circuit 280. The memory controller 110 includes a static random access memory (SRAM) 111, a central processing unit (CPU) 112, a host interface (I/F) 113, a signal processing module 114, and a memory I/F 115. The signal processing module 114 is positioned within the memory controller 110 in the current embodiments illustrated in FIG. 1A, but the present inventive concept is not restricted to the current embodiments. For instance, the signal processing module 114 may be positioned outside the memory controller 110 and interfaced with the memory controller 110.

Since those of ordinary skill in the art can easily understand the functions of the SRAM 111, the CPU 112, the host I/F 113, and the memory I/F 115, descriptions thereof will be omitted. The signal processing module 114 will be described in detail with reference to FIG. 2 later.

The memory cell array 230 includes a main area 231 and a spare area 232. The main area 231 may be used to store user data, and is thus referred to as a user data area. The spare area 232 may also be used to store error correcting code (ECC) information.

The decoder 240 may select a word line from among a plurality of word lines in response to a row address, provide a first operating voltage to the selected word line, and provide a second operating voltage to unselected word lines. For instance, the decoder 240 may provide the first operating voltage (e.g., a program voltage) to the selected word line and the second operating voltage (e.g., a pass voltage) to the unselected word lines in a program mode, and may provide a first operating voltage (e.g., a ground voltage) to the selected word line and a second operating voltage (e.g., a read voltage) to the unselected word lines in a read mode.

The write driver/SA circuit 250 is selectively connected with a plurality of bit lines and writes (or programs) data to selected memory cells, or reads data by sensing and amplifying the data from the selected memory cells. The write driver/SA circuit 250 may include a plurality of data storage units (not shown) to store a data set to be programmed in a program operation and to store a data set that has been read from memory cells in a read operation. Each of the data storage units may be implemented by a latch. The data storage units may also store a data set that has been read in a program verify operation.

A switching block (not shown) may also be provided between the write driver/SA circuit 250 and the memory cell array 230 to selectively connect a write driver or an SA with the plurality of bit lines.

The chip controller 260 outputs internal control signals (not shown) to control the operations (e.g., the program operation, the erase operation, and the read operation) of the non-volatile memory device 120 in response to an external command. The analog voltage generator 270 generates voltages, e.g., a program voltage, a pass voltage, and a read voltage, necessary for the operations of the non-volatile memory device 120.

The I/O circuit 280 interfaces with an external device, e.g., the memory controller 110. In detail, the I/O circuit 280 may receive a command and data to be programmed from the external device and transmit a status signal and data that have been read to the external device.

The memory controller 110 controls data exchange between a host and the non-volatile memory device 120. For instance, the memory controller 110 controls the non-volatile memory device 120 to write or read data in compliance with the host.

Figure 1B:
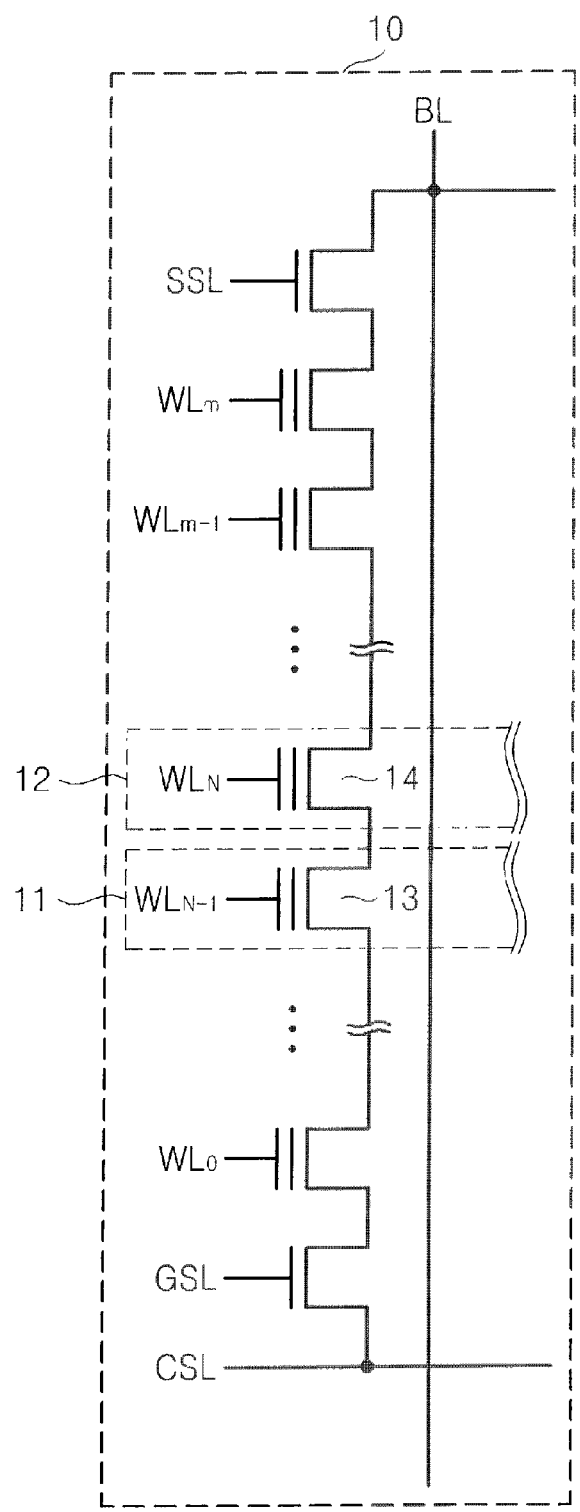
FIG. 1B is a diagram showing a part of a memory cell array of a non-volatile memory device according to some embodiments of the present inventive concept.

FIG. 1B is a diagram showing a part of the memory cell array 230 of the non-volatile memory device 100 according to some embodiments of the present inventive concept. FIG. 1B shows a single string 10 included in the memory cell array 230.

Referring to FIG. 1B, a single bit line BL may be connected to the string 10. The string 10 may include a string select line SSL and a ground select line GSL. A drain of a transistor connected to the string select line SSL is connected with the bit line BL and a source of a transistor connected to the ground select line GSL is connected to a common source line CSL in the string 10. A plurality of transistors are connected in series between the source of the transistor connected to the string select line SSL and the drain of the transistor connected to the ground select line GSL. Gates of the respective transistors connected in series between the string select line SSL and the ground select line GSL are connected with word lines $WL_0$ through $WL_m$, respectively.

The transistor connected to the string select line SSL is controlled by a voltage applied through the string select line SSL and the transistor connected to the ground select line GSL is controlled by a voltage applied through the ground select line GSL. The transistors connected in series between the string select line SSL and the ground select line GSL may be respectively controlled by voltages respectively applied through the word lines $WL_0$ through $WL_m$. Each of the transistors is a single memory cell and stores data. Usually, data is programmed to or read from the transistors in order, or in reverse order, from the transistor connected with the word line $WL_0$ to the transistor connected with the word line $WL_m$. For instance, after data which is stored in a transistor 13 positioned in an (N−1)-th page 11 is read, data stored in a transistor 14 positioned in an N-th page 12 may be read sequentially.

According to some embodiments of the present inventive concept, however, data may be programmed or read not only in one direction, but in both directions. For instance, data may be read from the transistor 14 in the N-th page 12 after data is read from the transistor 13 in the (N−1)-th page 11, and then the data may be read again from the transistor 13 in the (N−1)-th page 11. This operation will be described in detail below.

Figure 2:
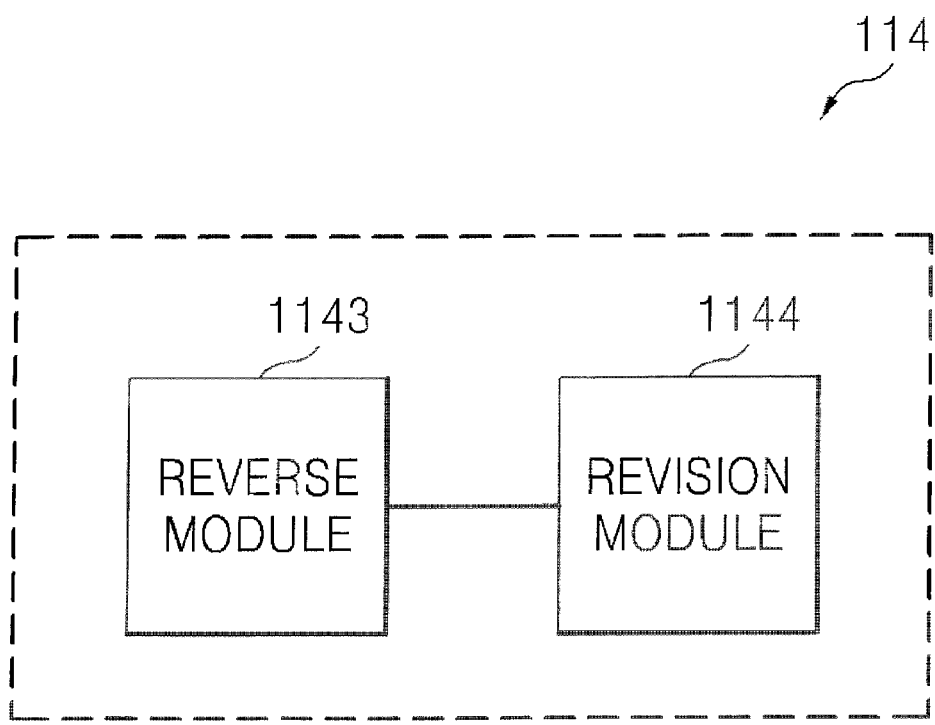
FIG. 2 is a detailed diagram of a signal processing module illustrated in FIG. 1A.

FIG. 2 is a detailed diagram of the signal processing module 114 illustrated in FIG. 1A. Referring to FIG. 2, the signal processing module 114 includes a reverse module 1143 and a revision module 1144.

The signal processing module 114 enables data to be read from, or programmed to, the memory array 231 using a read level of a memory cell in the memory array 231. The signal processing module 114 generates a command signal to control the chip controller 260 to generate internal control signals (not shown) which in turn control the operations (e.g., the program, erase and read operations) of the non-volatile memory device 120.

In detail, the signal processing module 114 estimates a capacity coupling effect (e.g., a threshold voltage variation) in a memory cell and revises a read level and/or a state of the memory cell, so that the chip controller 260 outputs the internal control signals to control the non-volatile memory device 120. In other words, the signal processing module 114 may estimate the capacity coupling effect (e.g., the threshold voltage variation) of a memory cell and revise the read level and/or the state of the memory cell. The signal processing module 114 may output different command signals to the chip controller 260 according to the result of the estimation and the revision, and the chip controller 260 may control the operations of the non-volatile memory device 120 according to the command signals.

The reverse module 1143 may read a second page (e.g., an N-th word line), which has not been read and is adjacent to a first page (e.g., an (N−1)-th word line) that has already been read, and then enable reading or revision using a read level of the first page in the memory array 231, so that a page reading order is changed, as described above with reference to FIG. 1B.

The revision module 1144 revises the read level of a memory cell. For instance, when reading is performed using the read level of the first page again by the operation of the reverse module 1143, the revision module 1144 may revise the read level of the first page. In addition, the revision module 1144 revises the state of a memory cell in the second page according to a result of detecting the change in state of the memory cell in the first page based on the read level of the first page. For instance, when a change is detected in the state of the memory cell in the first page, the revision module 1144 may revise the un-programmed state of the memory cell in the second page to the programmed state.

Here, a "module" may indicate a functional or structural combination of hardware to realize the technical ideas of the present inventive concept and software to drive the hardware. For instance, the module may be a logical or functional unit including a predetermined program code and a hardware resource to execute the program code, and may not necessarily be a physically-connected program code or a single type of hardware.

FIGS. 3A and 3B show the distributions of memory cells in an N-th word line WL#N and an (N−1)-th word line WL#N−1 according to some embodiments of the present inventive concept.

When data is programmed to or read from memory cells, it progresses from the first word line (or the first page) toward the last word line (or the last page). When the N-th word line WL#N is subjected to the programming later than the (N−1)-th word line WL#N−1, capacity coupling effect occurs in memory cells in the (N−1)-th word line WL#N−1 due to the programming of the N-th word line WL#N. In this case, when the (N−1)-th word line WL#N−1 is read thereafter, a predetermined read level of the (N−1)-th word line WL#N−1 may be revised or reset with consideration of the capacity coupling effect, but the present inventive concept is not restricted thereto. For instance, the (N−1)-th word line WL#N−1 may be read without revising the predetermined read level of the (N−1)-th word line WL#N−1.

Referring to FIG. 3A, it may be assumed that a first state STATE 1 of the N-th word line WL#N is an erased state and second through fourth states STATE 2 through STATE 4 of the N-th word line WL#N are a first programmed state, a second programmed state, and a third programmed state, respectively. Memory cells in a partial area 20 of the second state STATE 2 are in the first programmed state even though having a negative threshold voltage (Vth).

When data is read from memory cells with a negative read level, cells having a threshold voltage lower than the read level are read as being in an un-programmed or erased state. In addition, memory cells having a negative threshold voltage may be read as being in the erased state.

Since the memory cells in the partial area 20 have the negative threshold voltages, they are read as being in the un-programmed state even though they are actually in the first programmed state STATE 2. As a result, a wrong determination that the N-th word line WL#N hardly causes a capacity coupling effect in the (N−1)-th word line WL#N−1 is made. In other words, when a programmed memory cell is mistaken as being un-programmed due to having a negative threshold voltage, it can be wrongly determined that no capacity coupling effect has been caused by the programmed memory cell.

Referring to FIG. 3B, the (N−1)-th word line WL#N−1 having a capacity coupling effect due to the negative portion of the N-th word line WL#N has a first state STATE 1', a second state STATE 2', a third state STATE 3', and a fourth state STATE 4'. The second through fourth states STATE 2', STATE 3', and STATE 4' include first distributions 21, 31, and 41, respectively, and second distributions 22, 32, and 42, respectively.

The first distributions 21, 31, and 41 are distributions that are less affected by the capacity coupling effect and the second distributions 22, 32, and 42 are distributions that are more affected by the capacity coupling effect. Distributions less affected by the capacity coupling effect are distributions in which a variation in threshold voltage due to the influence of the N-th word line WL#N is minimal. Distributions more affected by the capacity coupling effect are distributions in which a variation in threshold voltage due to the influence of the N-th word line WL#N is substantial.

Here, reference that the variation in threshold voltage is minimal means that since the variation in threshold voltage is less than a predetermined value, there are nearly no changes in the states of memory cells when the (N−1)-th word line WL#N−1 is re-read using the predetermined read level. It may be said that there is a change in the state of a memory cell in a case where the memory cell which was in the first programmed state in a previous reading is in the second programmed state in a current reading, or where the memory cell which was read as being in the first programmed state using an unrevised read level is read as being in the second programmed state using a revised read level. Reference that the variation in threshold voltage is substantial means that since the variation in threshold voltage is greater than the predetermined value, there are changes in the states of memory cells when the read level of the (N−1)-th word line WL#N−1 is revised and the (N−1)-th word line WL#N−1 is re-read using the revised read level. It may be said that there is a change in the state of a memory cell in a case where the memory cell which was in the first programmed state in a previous reading is in the second programmed state in a current reading, or where the memory cell which was read as being in the first programmed state using an unrevised read level is read as being in the second programmed state using a revised read level. However, the present inventive concept is not restricted to the current embodiments.

The negative portion of the N-th word line WL#N includes the first state STATE 1 and the partial area 20 of the second state STATE 2. The first state STATE 1 is the un-programmed (or erased) state and thus hardly affects the change in threshold voltage of the (N−1)-th word line WL#N−1. The partial area 20 of the second state STATE 2 is the first programmed state and thus affects the change in threshold voltage of the (N−1)-th word line WL#N−1. However, even though the memory cells in the negative portion are in the programmed state, they are read as being in the un-programmed state. Accordingly, the memory cells in the partial area 20 are wrongly read as being in the un-programmed state. This will be described in detail with reference to FIG. 4 below.

Figure 4:
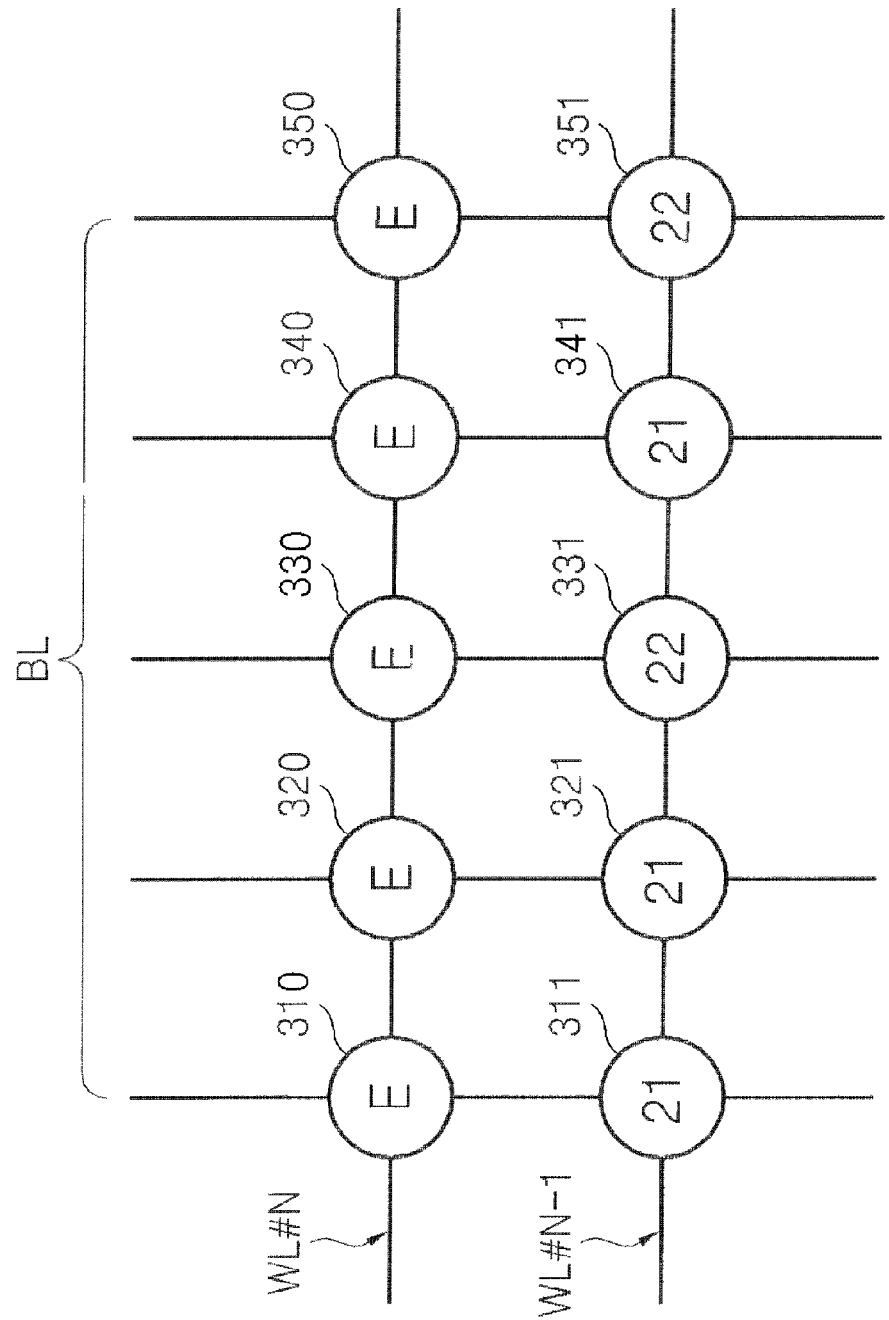
FIG. 4 shows some memory cells in the N-th word line and the (N−1)-th word line according to some embodiments of the present inventive concept.

FIG. 4 shows ten memory cells 310, 320, 330, 340, 350, 311, 321, 331, 341, and 351 positioned in bit lines BL, the N-th word line, and the (N−1)-th word line according to some embodiments of the present inventive concept. The five memory cells 311, 321, 331, 341, and 351 positioned in the (N−1)-th word line WL#N−1 are in different states and the five memory cells 310, 320, 330, 340, and 350 positioned in the N-th word line WL#N are all detected as being in the un-programmed or erased state.

Since memory cells 310, 320, 330, 340, and 350 in the N-th word line WL#N are determined to be in the un-programmed or erased state, they are supposed to hardly affect the change in threshold voltage of the memory cells 311, 321, 331, 341, and 351 in the (N−1)-th word line WL#N−1. Among the memory cells 311, 321, 331, 341, and 351 in the (N−1)-th word line WL#N−1, however, some memory cells 311, 321, and 341 having the minimal variation $\Delta V_0$ in threshold voltage are included in the first distribution 21 (FIG. 3B) and the other memory cells 331 and 351 having the substantial variation $\Delta V_1$ in threshold voltage are included in the second distribution 22 (FIG. 3B). In other words, among the memory cells 310, 320, 330, 340, and 350 in the N-th word line WL#N, the memory cells 330 and 350 adjacent to the memory cells 331 and 351 having the substantial variation $\Delta V_1$ are considered as actually being in the first programmed state (e.g., the partial area 20), not in the un-programmed or erased state. This means that there are some memory cells that are detected as being in the un-programmed or erased state but are actually in the programmed state among the memory cells in the N-th word line WL#N.

To determine whether the states of memory cells have been wrongly detected, the read level of the (N−1)-th word line WL#N−1 is revised. In other words, the read level may be shifted by a predetermined value to set a new read level. At this time, the predetermined value may be changed depending on the channel states, e.g., endurance and retention, of memory cells and may be stored in a table form in a buffer (not shown) or the spare area 232 within the non-volatile memory device 120 in advance.

When memory cells in the (N−1)-th word line WL#N−1 are re-read using an old read level or a new read level, there may be some memory cells (e.g., 331 and 351) which are read as being in different states than before. These memory cells 331 and 351 have the substantial variation $\Delta V_1$ in threshold voltage and the memory cells 330 and 350 adjacent these memory cells 331 and 351 may actually be in the programmed state. This is because the variation in threshold voltage of the memory cells 331 and 351 would have been greatly affected by the memory cells 330 and 350 that have actually been in the programmed state.

In the current embodiments, in a case where the states of the memory cells 331 and 351 having the substantial variation $\Delta V_1$ in threshold voltage change when the (N−1)-th word line WL#N−1 is re-read, among the memory cells 310, 320, 330, 340, and 350 in the N-th word line WL#N the memory cells 330 and 350 adjacent to the memory cells 331 and 351 are immediately considered as being actually in the first programmed state (e.g., the partial area 20), not in the un-programmed or erased state. However, the present inventive concept is not restricted to the current embodiments.

For instance, instead of immediately considering the memory cells 330 and 350 as being in the first programmed state (e.g., the partial area 20), the read level of the (N−1)-th word line WL#N−1 may be revised several times and cells actually in the first programmed state (e.g., cells belonging to the partial area 20) may be found among memory cells in the N-th word line WL#N using a probability according to a predetermined source with general consideration of the threshold voltage variations of memory cells in the (N−1)-th word line WL#N−1 and the state changes of the memory cells depending on the threshold voltage variations. In detail, when the read level of the (N−1)-th word line WL#N−1 is revised several times, memory cells in the N-th word line WL#N that correspond to memory cells whose states frequently change due to the change in threshold voltage in the (N−1)-th word line WL#N−1 are highly likely to be actually in the first programmed state (e.g., the partial area 20).

FIGS. 5A and 5B show the distributions of memory cells in an N-th word line and an (N−1)-th word line that have reached an end-of-life (EOL) stage, according to some embodiments of the present inventive concept. Unlike the states illustrated in FIGS. 3A and 3B, states illustrated in FIGS. 5A and 5B may overlap each other due to charge loss at the EOL stage.

When the N-th word line WL#N is subjected to programming or reading later than the (N−1)-th word line WL#N−1, capacity coupling effect occurs in memory cells in the (N−1)-th word line WL#N−1 due to the programming of the N-th word line WL#N. In this case, when the (N−1)-th word line WL#N−1 is read, a predetermined read level of the (N−1)-th word line WL#N−1 may be revised or reset with consideration of the capacity coupling effect, but the present inventive concept is not restricted thereto.

Referring to FIG. 5A, it may be assumed that a first state STATE 1 of the N-th word line WL#N is an erased state and second through fourth states STATE 2 through STATE 4 of the N-th word line WL#N are a first programmed state, a second programmed state, and a third programmed state, respectively. Memory cells in a partial area 20' of the second state STATE 2 are in the first programmed state even though having a negative threshold voltage (Vth).

When data is read from memory cells with a negative read level, cells having a threshold voltage lower than the read level are read as being in an un-programmed or erased state. In addition, memory cells having a negative threshold voltage may be read as being in the erased state.

Since the memory cells in the partial area 20' have negative threshold voltages, they are read as being in the un-programmed state even though they are actually in the first programmed state STATE 2. As a result, a wrong determination that the N-th word line WL#N hardly causes a capacity coupling effect in the (N−1)-th word line WL#N−1 is made.

Referring to FIG. 5B, the (N−1)-th word line WL#N−1 having a capacity coupling effect due to the negative portion of the N-th word line WL#N has a first state STATE 1', a second state STATE 2', a third state STATE 3', and a fourth state STATE 4'. The second through fourth states STATE 2', STATE 3', and STATE 4' include first distributions 21', 31', and 41', respectively, and second distributions 22', 32', and 42', respectively.

The first distributions 21', 31', and 41' are distributions that are less affected by the capacity coupling effect and the second distributions 22', 32', and 42' are distributions that are more affected by the capacity coupling effect. Distributions less affected by the capacity coupling effect are distributions in which a variation in threshold voltage due to the influence of the N-th word line WL#N is minimal. Distributions more affected by the capacity coupling effect are distributions in which a variation in threshold voltage due to the influence of the N-th word line WL#N is substantial (i.e., larger than the less affected distributions).

Here, reference that the variation in threshold voltage is minimal means that since the variation in threshold voltage is less than a predetermined value, there are nearly no changes in the states of memory cells when the (N−1)-th word line WL#N−1 is re-read using the predetermined read level. It may be said that there is a change in the state of a memory cell in a case where the memory cell which was in the first programmed state in a previous reading is in the second programmed state in a current reading, or where the memory cell which was read as being in the first programmed state using an unrevised read level is read as being in the second programmed state using a revised read level. That the variation in threshold voltage is substantial means that since the variation in threshold voltage is greater than the predetermined value, there are changes in the states of memory cells when the read level of the (N−1)-th word line WL#N−1 is revised and the (N−1)-th word line WL#N−1 is re-read using the revised read level. It may be said that there is a change in the state of a memory cell in a case where the memory cell which was in the first programmed state in a previous reading is in the second programmed state in a current reading, or where the memory cell which was read as being in the first programmed state using an unrevised read level is read as being in the second programmed state using a revised read level. However, the present inventive concept is not restricted to the current embodiments.

The negative portion of the N-th word line WL#N includes the first state STATE 1 and the partial area 20' of the second state STATE 2. The first state STATE 1 is the un-programmed (or erased) state and thus hardly affects the change in threshold voltage of the (N−1)-th word line WL#N−1. The partial area 20' of the second state STATE 2 is the first programmed state and thus affects the change in threshold voltage of the (N−1)-th word line WL#N−1. However, even though the memory cells in the negative portion are in the programmed state, they are read as being in the un-programmed state. Accordingly, the memory cells in the partial area 20' are wrongly read as being in the un-programmed state.

As described above, the states may overlap each other due to charge loss at the EOL stage, as illustrated in FIGS. 5A and 5B. Accordingly, read levels for efficiently distinguishing each state from other states need to be revised or reset. The read levels may be revised or reset by being shifted by a predetermined value. The predetermined value may be stored in a table form in a buffer (not shown) or the spare area 232 within the non-volatile memory device 120 in advance.

Figure 6:
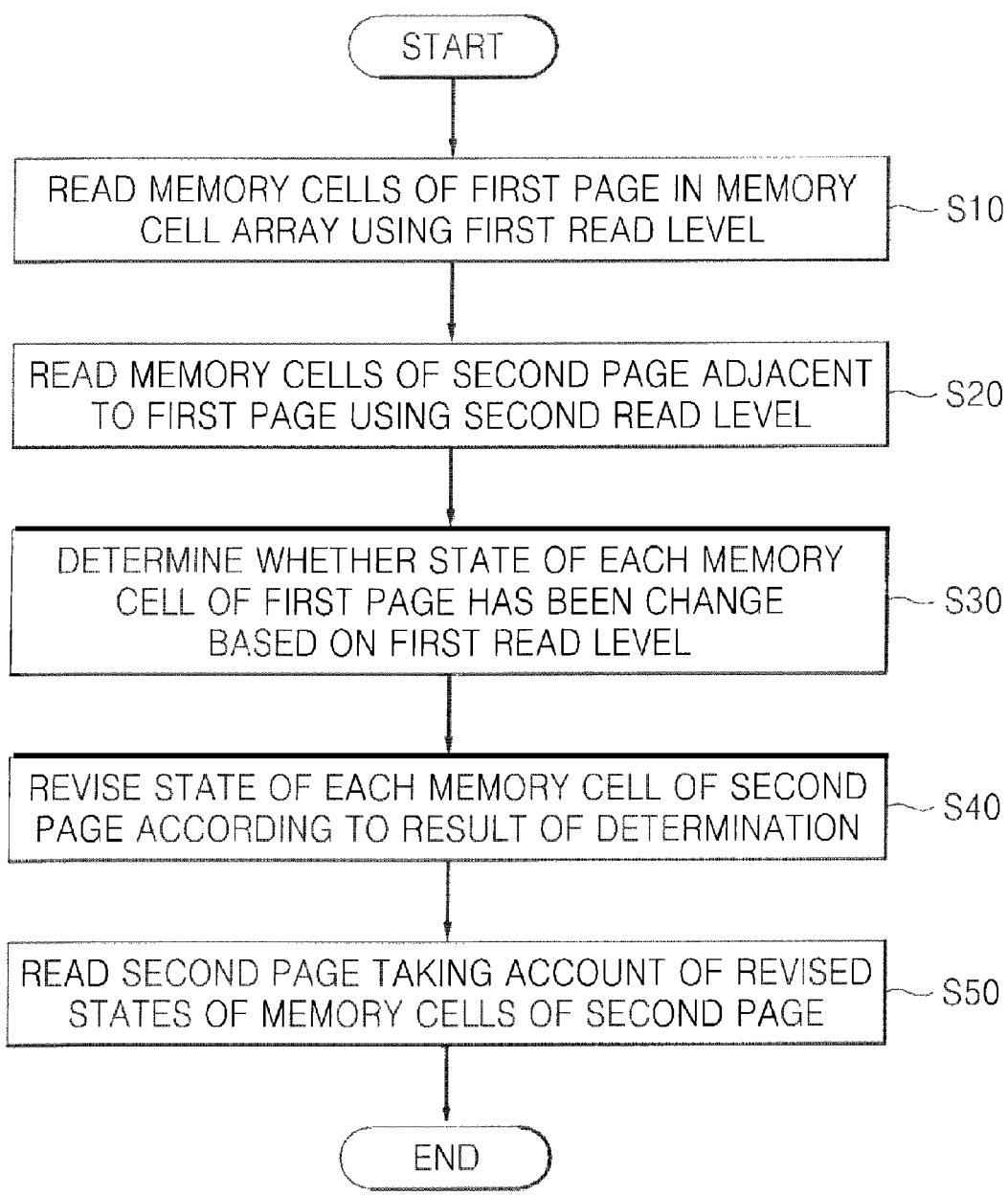
FIG. 6 is a flowchart of a method of reading data in a non-volatile memory device according to some embodiments of the present inventive concept.

FIG. 6 is a flowchart of a method of reading data in a non-volatile memory device according to some embodiments of the present inventive concept. Referring to FIG. 6, a plurality of memory cells of a first page in a memory cell array are read using a first read level in operation S10. A plurality of memory cells of a second page adjacent to the memory cells of the first page are read using a second read level in operation S20.

It is determined whether the state of each memory cell of the first page has been changed based on the first read level in operation S30. At this time, the first read level may be revised and a determination on the state change of the memory cell of the first page may be performed based on a revised first read level. At this time, revision of the first read level may be performed one or more times. According to a result of the determination, it may be verified whether each memory cell of the second page has a negative threshold voltage. The revision may be carried out by shifting the first read level by a predetermined value. The state change of a memory cell may be a change from an erased state to a first programmed state or from a first programmed state to a second programmed state.

The state of each memory cell of the second page is revised based on the result of the determination in operation S40. In detail, when it is determined that the state of a memory cell of the first page has been changed, a memory cell of the second page adjacent to the memory cell of the first page may be determined to be in the first programmed state and the state of the memory cell of the second page may be revised from the erased state to the first programmed state. At this time, when the first read level is revised one or more times, the revision of the memory cell of the second page may be performed using a probability of the state change of the memory cell of the first page.

In addition, when it is determined that the state of a memory cell of the first page has been changed, a memory cell of the second page, e.g., a memory cell having a negative threshold voltage in the second page, adjacent to the memory cell of the first page may be determined to be an erasure cell and decoded. At this time, the erasure cell is difficult to determine whether it has an error, e.g., its adjacent cell has a change in state.

Alternatively, the state of a memory cell of the second page may be determined and decoded based on a predetermined reference and then revised. In detail, a channel value (e.g., a log likelihood ratio (LLR)) of the memory cell of the second page may be set based on a predetermined reference and the memory cell of the second page may be soft-decision decoded to revise the state of the memory cell of the second page. The second page is read taking account of the revised state of each memory cell of the second page in operation S50.

Accordingly, memory cells that have been incorrectly read as being in an un-programmed state in an N-th page are correctly read as being in a programmed state, so that the N-th page can be more efficiently and accurately read.

Figure 7:
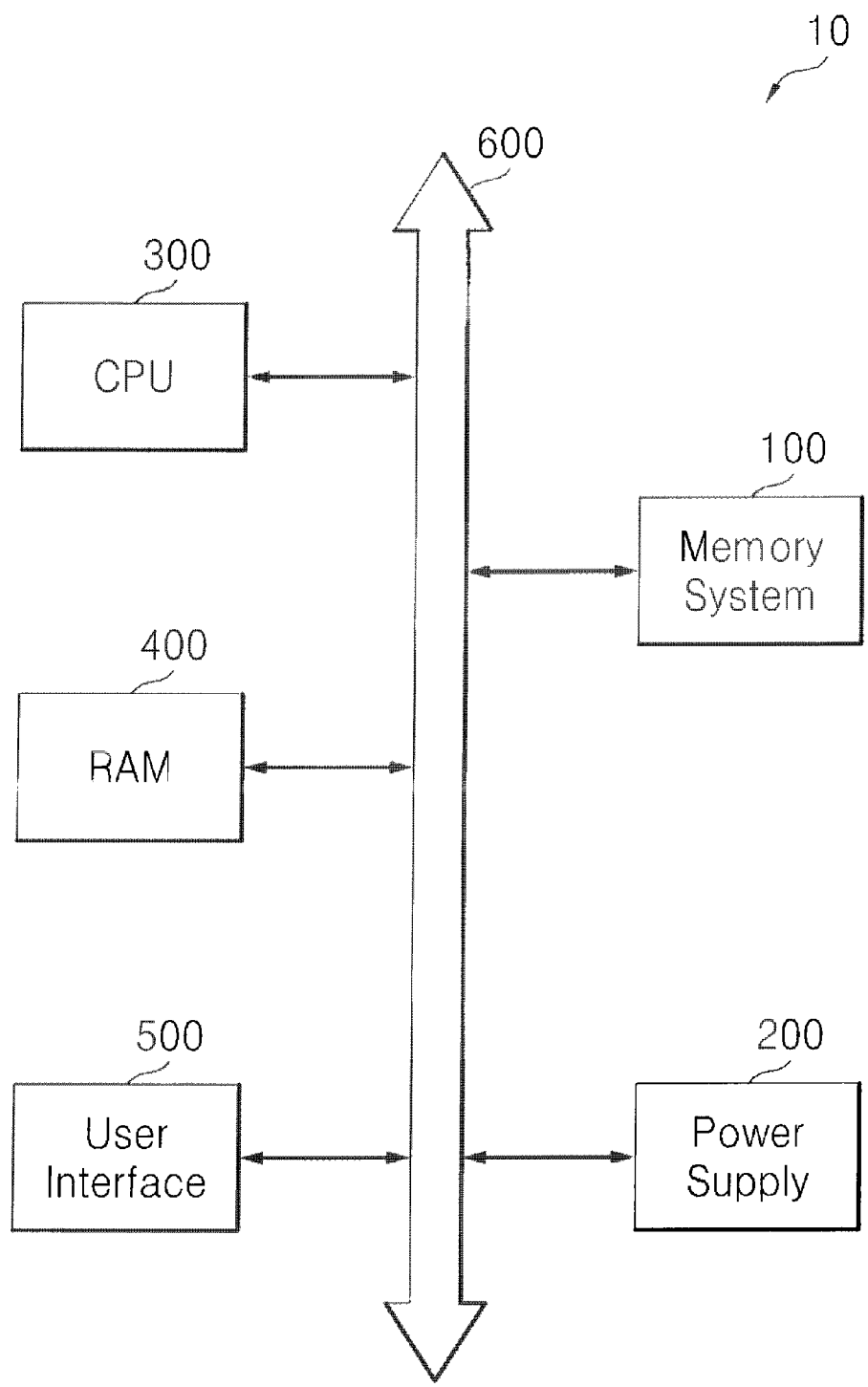
FIG. 7 is a block diagram of an electronic system according to some embodiments of the present inventive concept.

FIG. 7 is a block diagram of an electronic system according to some embodiments of the present inventive concept.

Referring to FIG. 7, the electronic system 10 according to the present exemplary embodiment may include a memory system 100, a power supply 200, a central processing unit (CPU) 300, a RAM 400, a user interface 500, and a system bus 600 electrically connecting these elements. The electronic system 10 may be equipped with a mobile device, a notebook computer, a desktop computer, etc.

The CPU 300 controls the overall operation of the electronic system 10. The RAM 400 stores information needed for the operation of the electronic system 10. The user interface 500 provides an interface between the electronic system 10 and a user. The power supply 200 supplies electric power to the internal constituent elements such as the CPU 300, the RAM 400, the user interface 500, and the memory system 100.

The CPU 300 may correspond to the host, and the memory system 100 may store or read data in response to a command from the host. The memory system 100 according to an exemplary embodiment of the present inventive concept is as described above. A detailed description thereof will be thus omitted.

Figure 8A:
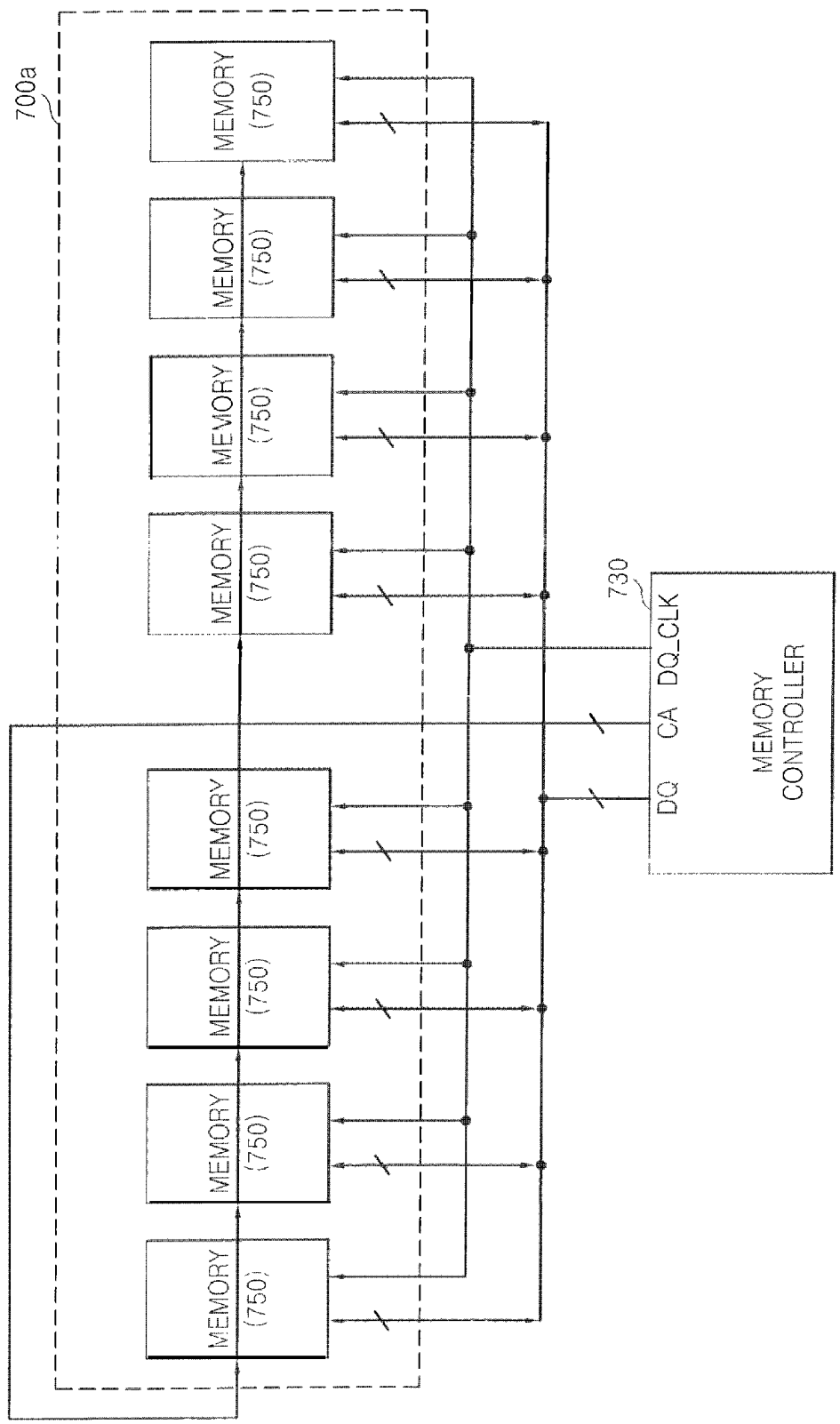
Figure 8B:
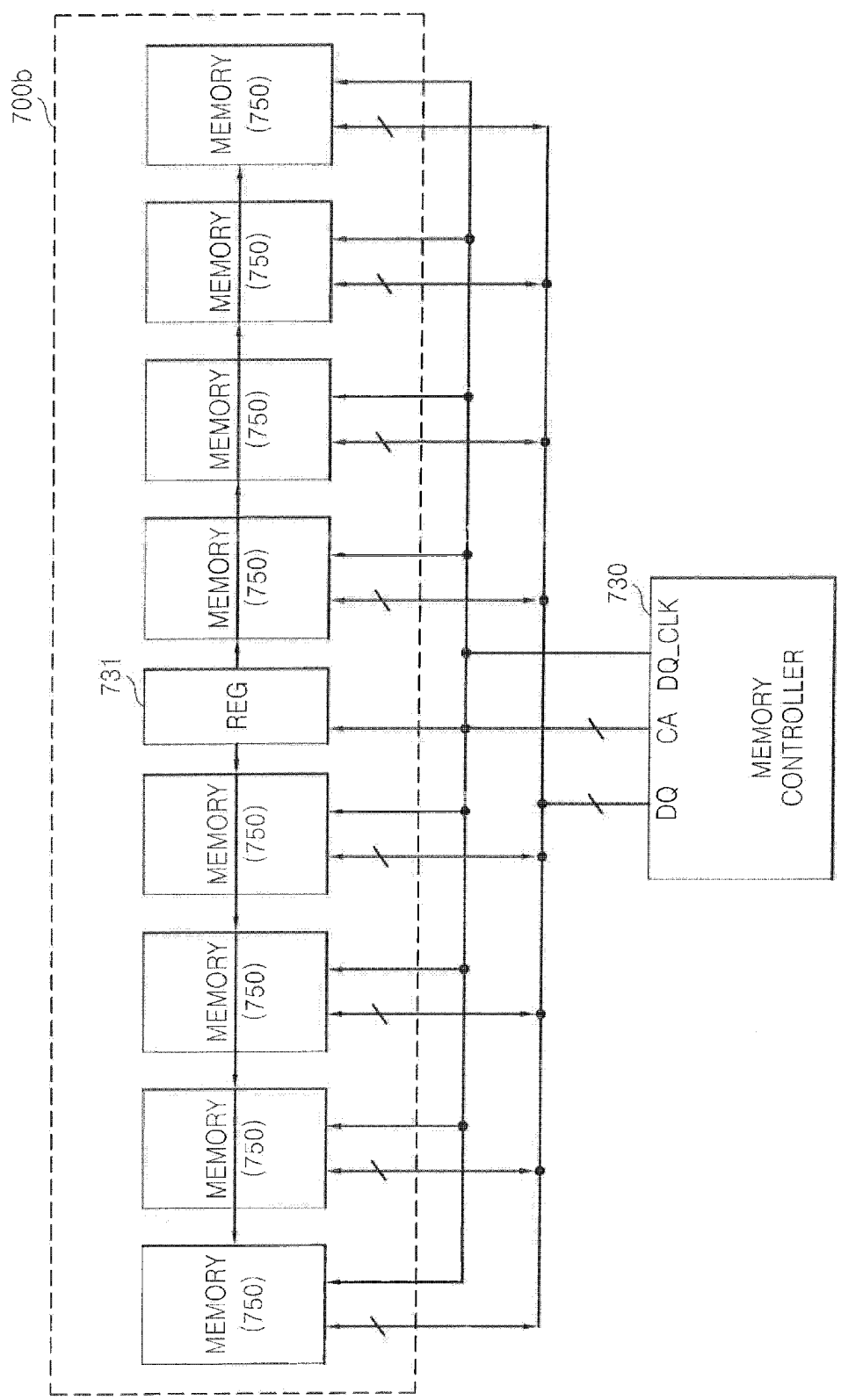

FIGS. 8A through 8C are block diagrams of memory modules 700a through 700c according to different embodiments of the present inventive concept.

The memory module 700a illustrated in FIG. 8A is an example of an un-buffered dual in-line memory module (UDIMM). The memory module 700a includes a plurality of semiconductor memory devices 750 which receive a command/address signal CA from the memory controller 730 and performs input and output of data DQ in response to a clock signal DQ_CLK. The memory module 700a may also include a data wire connected to each of the semiconductor memory devices 750 as an input/output passage of the data DQ to an outside, a command/address wire to transmit the command/address signal CA to the semiconductor memory devices 750, and a clock wire to provide the clock signal DQ_CLK to the semiconductor memory devices 750. The clock signal DQ_CLK, the command/address signal CA, and the data DQ are input from the memory controller 730 to each of the semiconductor memory devices 750 in the memory module 700a without passing through a separate buffer.

The memory module 700b illustrated in FIG. 8B is an example of a registered dual in-line memory module (RDIMM). While the command/address signal CA is input to the semiconductor memory devices 750 in the memory module 700b through a register circuit 731, the clock signal DQ_CLK and the data DQ are input to the semiconductor memory devices 750 without passing through the register circuit 731. The register circuit 731 may include a register to buffer the command/address signal CA. The register circuit 731 may be implemented on a chip set instead of the memory module 700b. In this case, the register circuit 731 may be removed from the memory module 700b.

The memory module 700c illustrated in FIG. 8C is an example of a fully buffered dual in-line memory module (FBDIMM), that is, the memory module 700c is an example of a memory module including a buffer 732. The memory module 700c including the buffer 732 is connected to an outside, i.e., the memory controller 730 through a single channel CH, as shown in FIG. 8C, and is able to communicate with the outside only through the buffer 732. In other words, the semiconductor memory devices 750 included in the memory module 700c receive the clock signal DQ_CLK, the command/address signal CA, and the data from the memory controller 730 and output the data DQ to the memory controller 730 only through the buffer 732 connected to the channel CH.

Some embodiments of the present inventive concept can be embodied in hardware, software, firmware or combination thereof. When the encoding method according to some embodiments of the present inventive concept is embodied in software, it can be embodied as computer readable codes or programs on a computer readable recording medium. The method according to some embodiments of the present inventive concept is embodied by executing the computer program to execute the encoding method stored in the computer readable recording medium.

The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

As described above, according to some embodiments of the present inventive concept, the states of memory cells are correctly and efficiently read even when the memory cells have negative threshold voltage due to charge loss or other causes.

While the present inventive concept has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A method of reading data in a non-volatile memory device, the method comprising:
   reading a plurality of memory cells of a first page in a memory cell array using a first read level;
   reading a plurality of memory cells of a second page adjacent to the memory cells of the first page using a second read level;
   determining whether a state of each memory cell of the first page has been changed based on the first read level to verify a threshold voltage of each memory cell of the second page based on the second read level;
   revising the state of each memory cell of the second page according to a result of the determination; and reading the second page taking account of revised states of the memory cells of the second page.

2. The method of claim 1, wherein the reading the memory cells using the second read level comprises reading at least one memory cell of the second page as having a negative threshold voltage.

3. The method of claim 2, wherein the determining whether the state of each memory cell of the first page has been changed comprises determining that the at least one memory cell having the negative threshold voltage in the second page is an un-programmed cell.

4. The method of claim 3, wherein the determining whether the state of each memory cell of the first page has been changed further comprises:
verifying which are programmed memory cells among memory cells having the negative threshold voltage in the second page.

5. The method of claim 4, wherein the revising the state of each memory cell of the second page comprises, when it is determined that the state of each memory cell of the first page has been changed since the memory cell of the first page has a large variation in threshold voltage based on the first read level, revising a state of a memory cell, which has the negative threshold voltage in the second page and is adjacent to the memory cell of the first page, to a programmed state.

6. The method of claim 4, wherein the revising the state of each memory cell of the second page comprises, when it is determined that the state of each memory cell of the first page has been changed since the memory cell of the first page has a large variation in threshold voltage based on the first read level, determining and decoding a state of a memory cell, which has the negative threshold voltage in the second page and is adjacent to the memory cell of the first page, according to a predetermined reference.

7. The method of claim 6, wherein the determining and decoding the state of the memory cell according to the predetermined reference comprises setting a channel value of the memory cell of the second page based on the predetermined reference and soft-decision decoding the memory cell of the second page.

8. The method of claim 4, wherein the revising the state of each memory cell of the second page comprises, when it is determined that the state of each memory cell of the first page has been changed since the memory cell of the first page has a large variation in threshold voltage based on the first read level, revising the first read level of the first page at least once, detecting a state change of the memory cell of the first page based on a revised first read level, determining the a memory cell having the negative threshold voltage in the second page to be an erasure cell, and decoding the memory cell.

9. The method of claim 8, wherein the revising the state of each memory cell of the second page further comprises, when it is determined that the state of each memory cell of the first page has not been changed since the memory cell of the first page has a small variation in threshold voltage based on the revised first read level, determining that the memory cell having the negative threshold voltage in the second page is in an un-programmed state so that the state of the memory cell of the second page is not revised.

10. The method of claim 1, wherein the method is performed on a multi-level cell.

11. A recording medium to store a program to execute the method of claim 1.

12. A memory controller to control a memory device, the memory controller reading memory cells using read levels and comprising:
a reverse module configured to enable a first page to be read again using a first read level when a second page, which has not been read, is adjacent to the first page that has already been read; and
a revision module configured to revise the first read level when the first page is read again using the first read level, wherein the memory controller is configured to enable values read using the read levels to be negative.

13. The memory controller of claim 12, wherein when values read using the second read level for the second page are negative, memory cells having a negative threshold voltage are determined to be un-programmed cells.

14. The memory controller of claim 13, wherein the revision module verifies programmed memory cells among the memory cells having the negative threshold voltage in the second page and revises the first read level for the first page.

15. The memory controller of claim 13, wherein the revision module revises the first read level for the first page by shifting the first read level by a predetermined value.

16. The memory controller of claim 13, wherein the revision module verifies which are programmed memory cells among the memory cells having the negative threshold voltage in the second page, revises the first read level for the first page, determines whether states of memory cells of the first page have been changed based on a revised first read level, and revises states of memory cells of the second page according to a result of the determination.

17. A memory system comprising:
a memory device; and
the memory controller of claim 12.

18. A method of reading a memory cell array of a non-volatile memory device, the method comprising:
estimating a threshold voltage variation of a memory cell array; and
outputting a command signal to a controller of the memory cell array to revise a read level of the memory cell array according to the result of the estimation;
wherein the estimating comprises:
reading a second page of the memory cell array which had not been read and is adjacent to a first page that has already been read; and
enabling reading or revision of a memory cell using a read level of the first page in the memory cell array such that a reading order is changed.

* * * * *